United States Patent
DiCarlo et al.

(10) Patent No.: US 7,354,865 B2
(45) Date of Patent: Apr. 8, 2008

(54) METHOD FOR REMOVAL OF PATTERN RESIST OVER PATTERNED METAL HAVING AN UNDERLYING SPACER LAYER

(75) Inventors: Anthony DiCarlo, Richardson, TX (US); Lisa A. Wesneski, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 10/750,142

(22) Filed: Dec. 31, 2003

(65) Prior Publication Data
US 2005/0148192 A1    Jul. 7, 2005

(51) Int. Cl.
*H01L 21/302* (2006.01)
(52) U.S. Cl. ............... 438/720; 438/706; 438/710; 134/1.1; 134/1.2
(58) Field of Classification Search ........... 438/706, 438/710, 712, 745, 720; 134/1.1, 1.2; 430/312, 430/313
See application file for complete search history.

(56) References Cited

U.S. PATENT DOCUMENTS

| | | | | |
|---|---|---|---|---|
| 4,646,424 A | * | 3/1987 | Parks et al. | 438/158 |
| 5,700,740 A | * | 12/1997 | Chen et al. | 438/710 |
| 6,296,988 B1 | * | 10/2001 | Lee | 430/318 |
| 6,472,315 B2 | * | 10/2002 | Nguyen et al. | 438/637 |
| 6,542,282 B2 | | 4/2003 | Smith et al. | |
| 2003/0095318 A1 | | 5/2003 | DiCarlo et al. | |
| 2004/0053505 A1 | * | 3/2004 | Chinn et al. | 438/710 |
| 2004/0063595 A1 | * | 4/2004 | Park et al. | 430/318 |

* cited by examiner

*Primary Examiner*—Lan Vinh
(74) *Attorney, Agent, or Firm*—Charles A. Brill; Wade James Brady, III; Frederick J. Telecky, Jr.

(57) ABSTRACT

A method of removing the pattern resist that remains on a microchip wafer after etching a patterned layer that is supported by a spacer layer. After the etch, the wafer is cleaned with a develop clean process that removes polymer residues from the pattern resist surface. Next is an ash to remove the hardened pattern resist surface, followed by removal of the pattern resist.

18 Claims, 4 Drawing Sheets

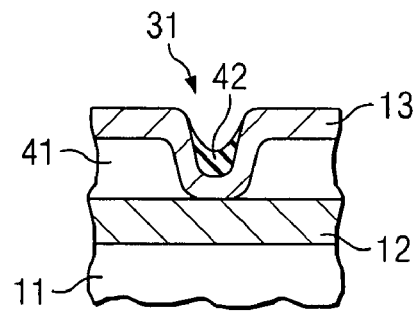
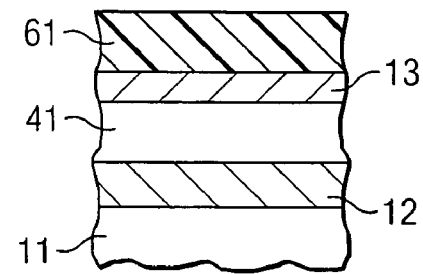
FIG. 5    FIG. 6
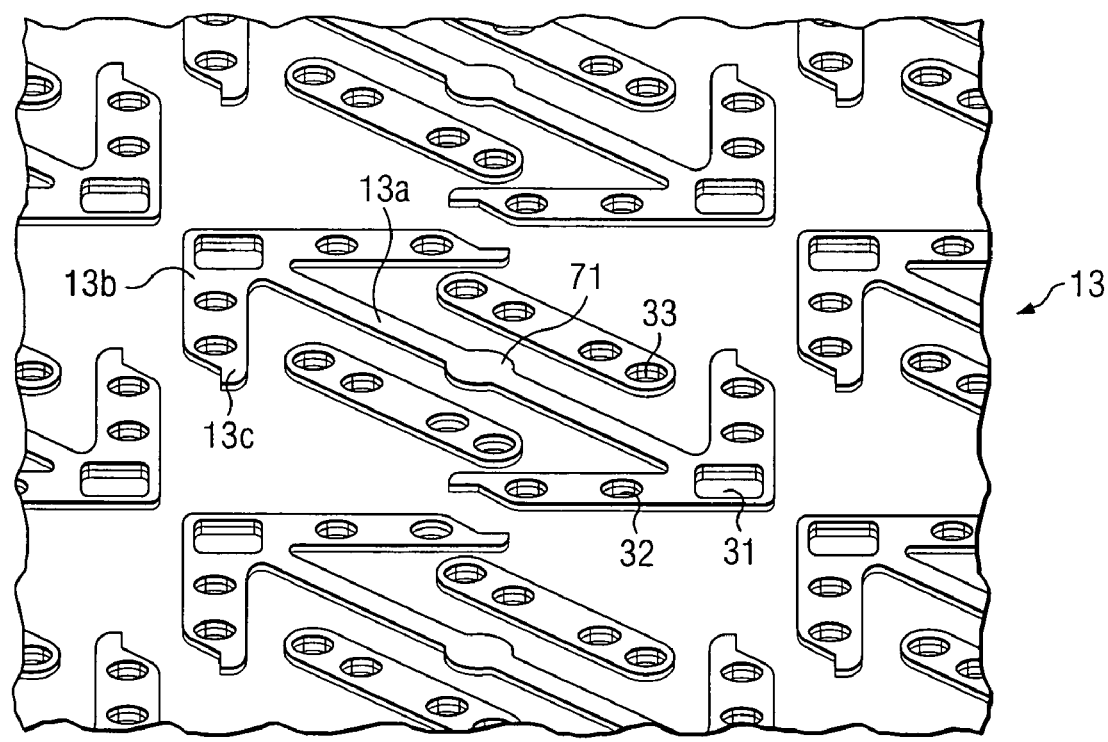
FIG. 7

METHOD FOR REMOVAL OF PATTERN RESIST OVER PATTERNED METAL HAVING AN UNDERLYING SPACER LAYER

TECHNICAL FIELD OF THE INVENTION

This invention relates to semiconductor fabrication, and more particularly to a post-metal-etch pattern-resist removal process.

BACKGROUND OF THE INVENTION

A Digital Micromirror Device™ (DMD™) is a type of microelectromechanical systems (MEMS) device. Invented in 1987 at Texas Instruments Incorporated, the DMD is a fast, reflective digital light switch. It can be combined with image processing, memory, a light source, and optics to form a digital light processing system capable of projecting large, bright, high-contrast color images. It has other applications in addition to image display, such as for optical light switching.

The DMD is fabricated using CMOS-like processes over a CMOS memory. It has an array of individually addressable mirror elements, each having an aluminum mirror that can reflect light in one of two directions depending on the state of an underlying memory cell.

For imaging application, by combining the DMD with a suitable light source and projection optics, the mirror reflects incident light either into or out of the pupil of a projection lens. A first state of the mirror appears bright and the second state of the mirror appears dark. Gray scale is achieved by binary pulsewidth modulation of the incident light. Color is achieved by using color filters, either stationary or rotating, in combination with one, two, or three DMD chips.

DMD's may have a variety of designs, and the most popular design in current use is a structure consisting of a mirror that is rigidly connected to an underlying yoke. The yoke in turn is connected by two thin, mechanically compliant torsion hinges to support posts that are attached to the underlying substrate. Electrostatic fields developed between the underlying memory cell and the yoke and mirror cause rotation in the positive or negative rotation direction.

The fabrication of the above-described DMD superstructure begins with a completed CMOS memory circuit. Through the use of six photomask layers, the superstructure is formed with alternating layers of aluminum for the address electrode, hinge, yoke, and mirror layers and hardened photoresist for sacrificial layers that form air gaps.

The metal layers are patterned using pattern resist and etching techniques. During removal of the resist after etching, it is important to not compromise the underlying sacrificial layer, which serves as support for the metal layer. It is not until late in the fabrication process that this sacrificial layer is removed to form the air gap.

SUMMARY OF THE INVENTION

One aspect of the invention is a method of removing post etch pattern resist. The invention is applicable for pattern resist that remains over a patterned layer (such as a patterned metal layer) supported by a sacrificial spacer layer.

Typically, the etch process leaves polymer residue and a hardened pattern resist skin. The polymers are removed with a develop clean process. Next, an ash process is used to remove the hardened skin. This facilitates a subsequent strip of the pattern resist.

An advantage of the above-described pattern resist removal process is that it minimizes "trenching" in the underlying sacrificial layer. Any trenching that does occur is shallower and more uniform than with other pattern resist removal methods. This more shallow and uniform trenching, in turn, results in improved DMD characteristics and performance, namely, flatter mirrors, better tilt angle uniformity, higher image contrast, and better "across the wafer and across the die" uniformity.

BRIEF DESCRIPTION OF THE DRAWINGS

FIG. 5 is a cross sectional view of the layers of a DMD wafer through deposition and etching of a first spacer layer.

FIG. 6 is a cross sectional view of the layers of a DMD wafer through deposition of a hinge patterning layer.

FIG. 7 is a perspective view of the surface of the hinge layer after patterning.

DETAILED DESCRIPTION OF THE INVENTION

For purposes of example, the following description is in terms of fabrication of a DMD. However, the same methods are applicable to any fabrication process that uses a patterned layer over a sacrificial layer. In the case of a DMD, the patterned layer is a hinge layer, described below in connection with FIGS. 6-8.

The completed device may be a semiconductor device or any other microchip device having these characteristics. MEMS devices are likely candidates for such an architecture and thus for application of the present invention.

The following fabrication process describes various deposition and patterning steps that result in various layers on a wafer. The term "wafer" is used herein to refer to the wafer and whatever layers presently exist during this process.

Figure 1:
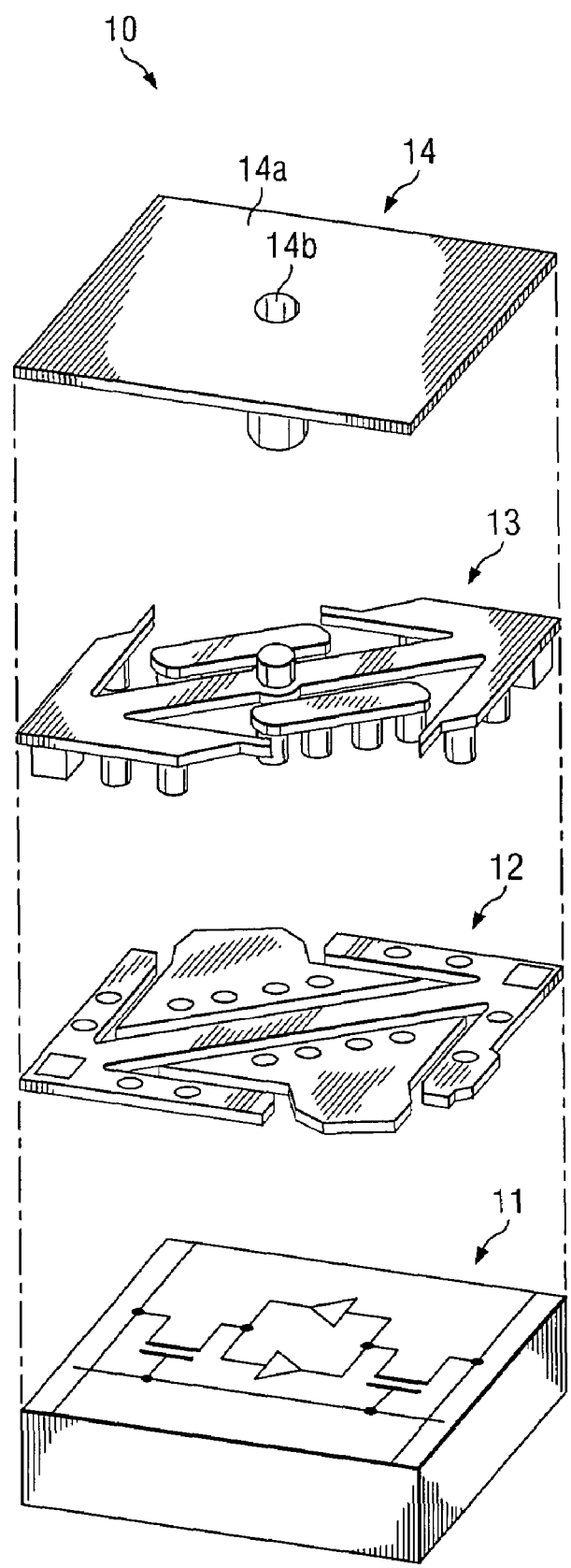
FIG. 1 is an exploded view of a DMD pixel element in accordance with the invention.

FIG. 1 is an exploded view of a DMD pixel element 10 in accordance with the invention. Pixel element 10 is one of an array of such elements fabricated on a wafer, using semiconductor fabrication techniques. The specific DMD design of FIG. 1 is sometimes referred to as the "KS" design.

DMD pixel element 10 is a monolithically integrated MEMS superstructure cell fabricated over a CMOS SRAM cell 11. Two sacrificial layers (see FIGS. 2 and 10) have been removed by plasma etching to produce air gaps between three metal layers of the superstructure. For purposes of this description, the three metal layers are "spaced" apart by being separated by these air gaps.

The uppermost metal layer 14 has a reflective mirror 14a. The air gap under the mirror 14a frees the mirror 14a to rotate about a compliant torsion hinge 13a, which is part of the second metal layer 13. A third metal (M3) layer 12 has address electrodes 12a for the mirror 14a, the address electrodes 12a being connected to SRAM cell 11. The M3 layer 12 further has a bias bus 12b, which interconnects the mirrors 14a of all pixels to a bond pad at the chip perimeter. An off-chip driver supplies the bias waveform necessary for proper digital operation.

The DMD mirrors 14a are each 16 um square and made of aluminum for maximum reflectivity. They are arrayed on 17 um centers to form a matrix having a high fill factor (~90%). The high fill factor produces high efficiency for light use at the pixel level and a seamless (pixelation-free) projected image. The hinge layer 13 under the mirrors 14a permits a close spacing of the mirrors 14, and because of the underlying placement of the hinges, an array of pixel elements 10 is referred to as a "hidden hinge" type DMD architecture.

In operation, electrostatic fields are developed between the mirror 14a and its address electrodes 12a, creating an electrostatic torque. This torque works against the restoring torque of the hinge 13a to produce mirror rotation in a positive or negative direction. The mirror 14a rotates until it comes to rest (or lands) against spring tips 13c, which are part of the hinge layer 13. These spring tips 13c are attached to the addressing layer 12, and thus provide a stationary but flexible landing surface for the mirror 14a.

FIGS. 2-10 illustrate the DMD fabrication process. As explained below, this process follows conventional DMD fabrication up through deposition of a first spacer layer, S1.

Figure 2:
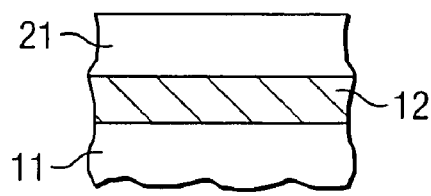
FIG. 2 is a cross sectional view of the layers of a DMD wafer through deposition and etching of a first spacer layer.

FIG. 2 is a cross sectional view of the layers of a DMD wafer through the deposition of the first spacer (S1) layer 21. The fabrication of the DMD superstructure begins with a completed CMOS memory circuit 11. Circuit 11 may be a conventional 5T or 6T SRAM cell. A thick oxide is deposited over the CMOS surface and then planarized, such as by using a chemical mechanical polish (CMP) technique. The CMP step provides a completely flat substrate for DMD superstructure fabrication.

Through the use of photomasking techniques, the M3 layer 12 is formed above the CMOS 11. This M3 layer 12 is formed with aluminum for address and bus circuitry. The aluminum is sputter-deposited and plasma-etched using plasma-deposited SiO2 as the etch mask. M3 layer 12 may be etched in a pattern used for DMD structures previously described in U.S. Pat. No. 6,028,690, entitled "Reduced Micromirror Gaps for Improved Contrast Ratio", and in U.S. Pat. No. 5,583,688, entitled "Multi-level Digital Micromirror Device", both assigned to Texas Instruments Incorporated. These patents are incorporated by reference herein.

A spacer layer 21, identified as S1, is then deposited over the M3 layer 11. Spacer layer 21 may be formed from hardened photoresist. A number of vias are then formed in spacer layer 21, using conventional pattern and etching techniques.

Figure 3:
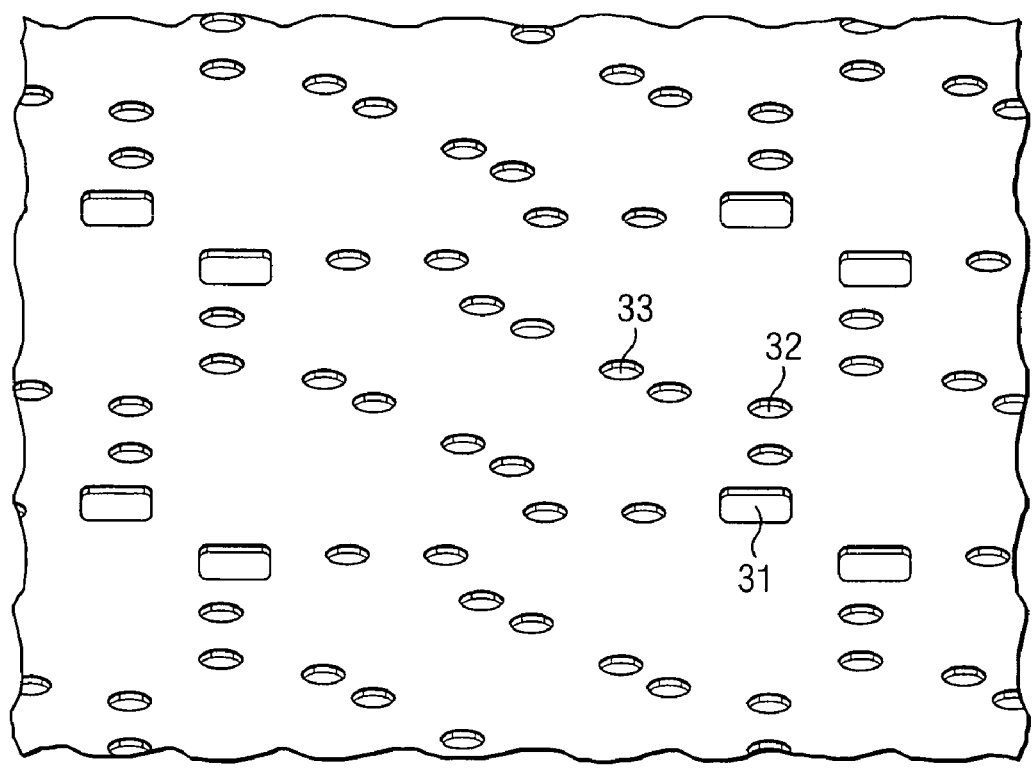
FIG. 3 is a perspective view of the surface of the first spacer layer.

FIG. 3 is a perspective view of the surface of the first spacer layer 21 after the vias have been formed. It illustrates spring tip support vias 31, hinge support vias 32, and electrode support vias 33.

As stated in the Background, spacer layer 21 is eventually removed to form an air gap under overlying structure. However, until that time, it provides support for a metal hinge layer directly above it, as well as other superstructure.

Figure 4:
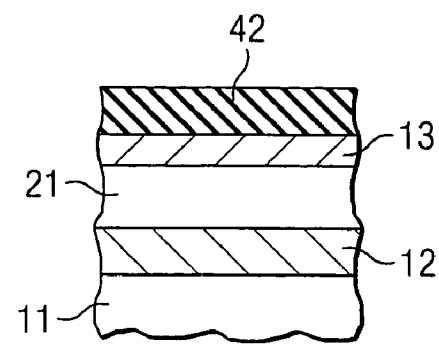
FIG. 4 is a cross sectional view of the layers of a DMD wafer through deposition of a hinge metal layer and oxide layer.

FIGS. 4-6 illustrate fabrication of hinge layer 13. As explained below, hinge layer 13 contains both hinge 13a, spring tip beams 13b, and spring tips 13c extending from the spring tip beams 13b.

Referring to FIG. 4, the hinge layer 13 is formed by deposition of the hinge metal layer 13 and an oxide layer 42. The hinge metal is typically an aluminum alloy, such as AlTiO. An example of a suitable thickness for hinge layer 13 is 840 angstroms. An example of a suitable thickness for oxide layer 42 is 5000 angstroms.

FIG. 5 illustrates a portion of the partially fabricated DMD having a via 31, 32, or 33, and the result of an etch process. The etch leaves an oxide coating within the vias 31, 32, or 33. The oxide at the bottom of the vias covers the thin metal at the bottom of each via, thereby providing strengthening.

A develop rinse is then performed, or other cleanup to remove residue and prevent surface contamination.

FIG. 6 illustrates the deposition and patterning of a hinge patterning layer 61. The patterning layer 61 is etched with a hinge etch mask in the pattern illustrated in FIG. 1.

The next steps, which occur after the etch but prior to removal of the patterning layer 61, are especially designed to avoid undue removal of the spacer layer 21. Specifically, these steps are designed to minimize "trenching", which compromises the ability of the spacer layer 21 to support subsequently fabricated layers. These effects jeopardize the desired flatness of the overlying mirror layer.

One difficulty of removing the pattern resist after the etch is that the etch process results in a UV hardened surface of the resist. It also results in polymer residues, such as fluorinated compounds, embedded on the surface of the pattern resist, particularly on sidewalls.

To this end, after the etch, a develop solution is used to remove polymers and other compounds on the surface of the resist. This develop process is sometimes referred to as a "develop clean" process. This process mimics the same develop step used during photolithography to develop resist material. The develop rinse is a basic solution, comprising mostly water with a small percentage of ammonium hydroxide and typically some surfactant. After the develop clean (which may include a dionized water rinse), the pattern resist has a hardened skin free of etch polymer buildup.

Next, a light ash process is used to remove the UV cured surface. This ash process is the same as is known in the art as a post-etch ash.

After the ash, Then patterning layer 61 is photochemically removed ("stripped"). An example of a suitable strip process is a PM acetate chemical strip process. Ideally, the resist removal is accomplished with minimal trenching of the spacer layer 21. Any trenching that does occur is uniform and shallow. The patterned hinge layer 13 is now ready for the next spacer layer deposition.

FIG. 7 is a perspective view of the surface of the patterned hinge layer 13. The various vias 31, 32, 33 are shown, as well as a hinge pad 71, upon which the mirror via 14a will end. Referring again to FIG. 1, the vias, now filled with deposited oxide material, form hollow support posts after the spacer layer 21 is removed. Two spring tips 13c are located under each of the two tilting corners of mirror 14a. In the embodiment of FIG. 7, the hinge 13a and spring tips 13c form a continuous pattern with the two spring tip beams 13b extending at an angle from each end of hinge 13a, but other patterns are possible. For example, one or two landing tips may be used, at a 45 degree or 90 degree angle orientation to the hinge.

Figure 8:
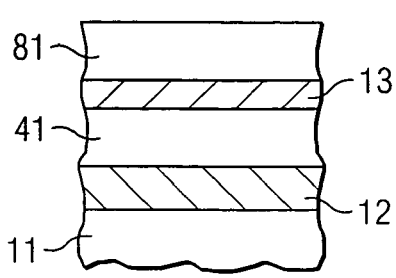
FIG. 8 is a cross sectional view of the layers of a DMD wafer through deposition of a second spacer layer.

FIG. 8 illustrates the deposition of second spacer (S2) layer 81. The mirror via 14a, illustrated in FIG. 1, is patterned and etched. The spacer resist is then cured and the surface descumed. A feature of the invention is that the gap between the mirror layer 14 and the hinge layer 13 can be reduced, as compared to conventional DMD designs. This reduces reflection off the hinge level in the gap, resulting in better image quality.

As stated above, the method of the invention is described in terms of DMD fabrication for purposes of example. It should be understood that FIGS. 6-8 are representative of any semiconductor device, in which a pattern resist layer 61 is used for an etch of an underlying pattern layer 13, which is supported by a spacer layer 41. In such structures, the function of the spacer layer 41 (which may or may not be subsequently removed) is to support the patterned layer 13. Thus, any process for removing the pattern resist 61 after the etch should be designed to preserve the spacer layer's supporting role.

Figure 9:
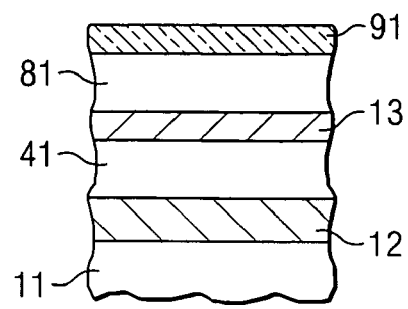
FIG. 9 is a cross sectional view of the layers of a DMD wafer through deposition of a mirror metal layer.

FIG. 9 illustrates deposition of metal mirror layer 91, from which mirror 14a is patterned. A typical thickness for mirror layer 91 is 3300 angstroms. The metal for mirror layer 91 is typically aluminum or an alloy of aluminum.

Figure 10:
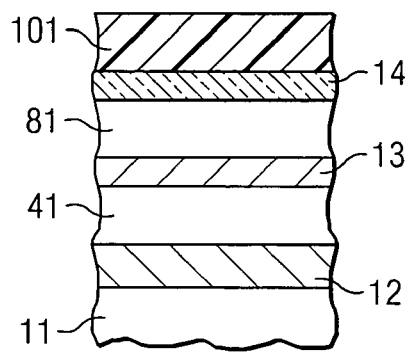
FIG. 10 is a cross sectional view of the layers of a DMD wafer through deposition of a mirror patterning layer.

FIG. 10 illustrates deposition of a mirror patterning layer 101, which is used to pattern mirror 14a. Mirror layer 14 is patterned and etched, leaving the mirror 14 of FIG. 1.

The packaging flow begins with the wafers partially sawed along the chip scribe lines to a depth that will allow the chips to be easily broken apart later. Before separating the chips from one another, each chip is tested for full electrical and optical functionality by a high-speed automated wafer tester. The chips are then separated from the wafer, and proceed to a plasma etcher that is used to selectively strip the organic sacrificial layers, S1 and S2, from under the mirror layer 14 and hinge layer 13. The chips are then plasma-cleaned, relubricated, and hermetically sealed in a package.

Figure 11:
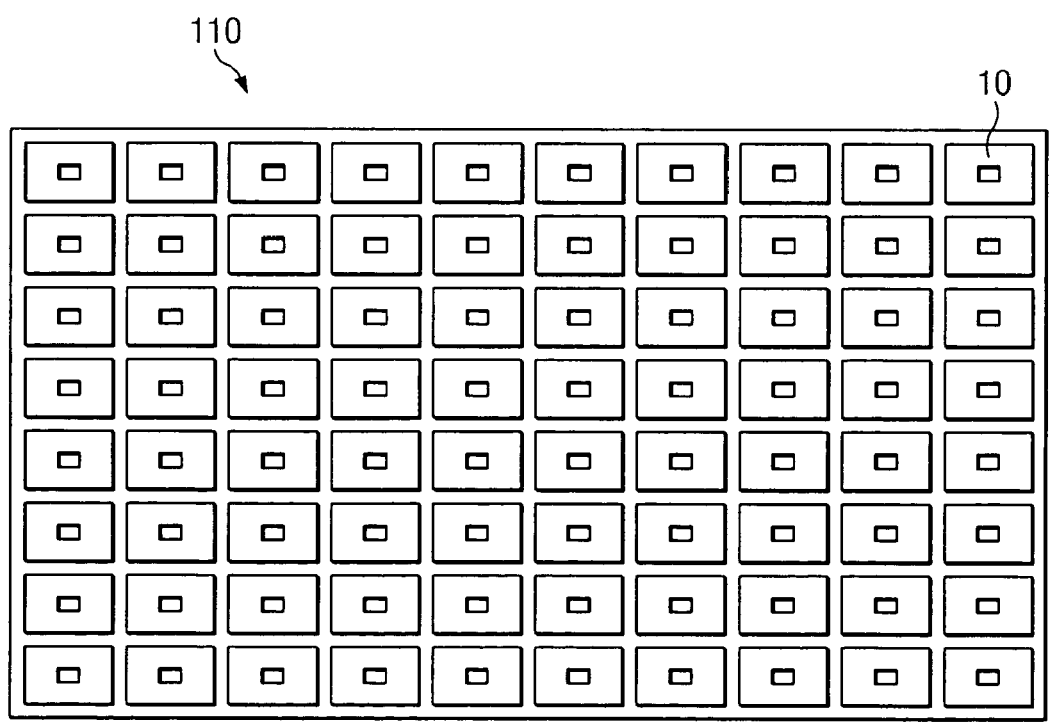
FIG. 11 is a top plan view of the mirror elements of a DMD array.

FIG. 11 is a top view of an array 110 of mirror elements 10. DMD arrays often have more than a thousand rows and columns of pixel elements 10. Packaged DMD chips are commercially available in various array sizes. For example, SVGA (800×600) and SXGA (1280×1024) arrays have been made. The diagonals of the active area are 0.7 inches and 1.1 inches, respectively.

OTHER EMBODIMENTS

Although the present invention has been described in detail, it should be understood that various changes, substitutions, and alterations can be made hereto without departing from the spirit and scope of the invention as defined by the appended claims.

What is claimed is:

1. A method of removing pattern resist, comprising the steps of:
    providing a wafer having an etched patterned layer and an overlying mask pattern resist outwardly from a spacer layer;
    cleaning the wafer with a develop solution;
    ashing the surface of the wafer;
    photochemically removing the pattern resist that remains after the cleaning and ashing steps; and
    selectively removing at least a majority of the spacer layer.

2. The method of claim 1, wherein the wafer is a micromechanical device wafer.

3. The method of claim 1, wherein the wafer is a DMD wafer.

4. The method of claim 1, wherein the cleaning step substantially removes polymer residue from the pattern resist.

5. The method of claim 1, wherein the ashing step substantially removes hardened skin from the pattern resist.

6. The method of claim 1, wherein the removing step is performed with an acetate strip process.

7. The method of claim 1, wherein the patterned layer is a metal layer.

8. A method, comprising the steps of:
    depositing a sacrificial layer;
    depositing material for a patterned layer;
    depositing a pattern resist material;
    etching the resist material and the material for the patterned layer;
    cleaning the resist material and remaining material for the patterned layer with a develop solution after said etching step;
    ashing the surface of the wafer after said cleaning step;
    photochemically removing the pattern resist that remains after the cleaning and ashing steps; and
    selectively removing the sacrificial layer.

9. The method of claim 8, wherein the wafer is a micromechanical device wafer.

10. The method of claim 8, wherein the wafer is a DMD wafer.

11. The method of claim 8, wherein the cleaning step substantially removes polymer residue from the pattern resist.

12. The method of claim 8, wherein the ashing step substantially removes hardened skin from the pattern resist.

13. The method of claim 8, wherein the removing step is performed with an acetate strip process.

14. The method of claim 8, wherein the patterned layer is a metal layer.

15. A method of forming a micromirror array, comprising the steps of:
    forming control circuitry on a semiconductor substrate;
    depositing a first spacer layer on the substrate;
    patterning the first spacer layer to define hinge support vias and spring tip support vias;
    depositing a hinge layer over the first spacer layer;
    forming at least one hinge etch mask on the hinge layer;
    patterning the hinge layer to form at least one hinge, wherein the pattern is formed using a pattern resist layer and an etch process;
    removing pattern resist that remains after the preceding step by: cleaning the wafer with a develop solution; ashing the surface of the wafer; and removing the pattern resist that remains after the cleaning and aching steps;
    depositing a second spacer layer over the hinge layer;
    patterning the second spacer layer to define mirror support vias;
    depositing a metal mirror layer over the second spacer layer;
    patterning the metal mirror layer to form an array of micro mirrors; and
    removing the first and the second spacer layers.

16. The method of claim 15, wherein the cleaning step substantially removes polymer residue from the pattern resist.

17. The method of claim 15, wherein the ashing step substantially removes hardened skin from the pattern resist.

18. The method of claim 15, wherein the removing step is performed with an acetate strip process.

* * * * *